US010830944B2

(12) United States Patent
Wakahara

(10) Patent No.: US 10,830,944 B2
(45) Date of Patent: Nov. 10, 2020

(54) OPENING AND CLOSING DETECTION SENSOR

(71) Applicant: CMIWS CO., LTD., Kyoto (JP)

(72) Inventor: Masahito Wakahara, Kyoto (JP)

(73) Assignee: CMIWS CO., LTD., Kyoto (JP)

( * ) Notice: Subject to any disclaimer, the term of this patent is extended or adjusted under 35 U.S.C. 154(b) by 0 days.

(21) Appl. No.: 16/621,209

(22) PCT Filed: Apr. 26, 2019

(86) PCT No.: PCT/JP2019/018000
§ 371 (c)(1),
(2) Date: Dec. 10, 2019

(87) PCT Pub. No.: WO2019/212048
PCT Pub. Date: Nov. 7, 2019

(65) Prior Publication Data
US 2020/0109970 A1 Apr. 9, 2020

(30) Foreign Application Priority Data
May 4, 2018 (JP) .................................. 2018-088974

(51) Int. Cl.
*G02B 6/02* (2006.01)
(52) U.S. Cl.
CPC ................................ *G02B 6/02076* (2013.01)
(58) Field of Classification Search
CPC ...... G02B 6/02076; G02B 2006/12138; G01L 1/242; G01L 1/246; G01D 5/353;
(Continued)

(56) References Cited

U.S. PATENT DOCUMENTS 6,563,970 B1 * 5/2003 Bohnert ................ G01L 9/0007
385/13
2002/0009252 A1 * 1/2002 Maron .................... G01L 1/246
385/12
(Continued)

FOREIGN PATENT DOCUMENTS

CN 201844820 * 5/2011 ............. G01B 11/02
CN 107390287 A 11/2017
(Continued)

OTHER PUBLICATIONS

International Search Report issued in PCT/JP2019/018000; dated Jun. 18, 2019.

*Primary Examiner* — Robert Tavlykaev
(74) *Attorney, Agent, or Firm* — Studebaker & Brackett PC

(57) ABSTRACT

An opening and closing detection sensor of the present invention includes a fixed base, a moving base, an optical fiber, and a moving member. The moving base is disposed so as to be movable relative to the fixed base. The optical fiber includes an FBG part where a Bragg wavelength varies responding to an interval between the fixed base and the moving base. The moving member moves between a first position corresponding to either one of an opened state or a closed state of an object and a second position corresponding to the other state. The moving member includes a locking part. The locking part abuts on the moving base between a third position located between the first position and the second position, and the second position, thereby moving the moving base together with the moving member, and moving the moving base in a direction separated from the fixed base.

19 Claims, 11 Drawing Sheets

(58) Field of Classification Search
CPC ............. G01D 5/3503; G01D 5/35316; G01D 5/35354; G01D 5/3537; G01D 5/35374
USPC ..................................................... 385/12, 13
See application file for complete search history.

(56) References Cited

U.S. PATENT DOCUMENTS

| | | | |
|---|---|---|---|
| 2002/0154860 A1* | 10/2002 | Fernald | G01L 11/025 385/37 |
| 2007/0193362 A1* | 8/2007 | Ferguson | G01B 11/18 73/800 |
| 2009/0126501 A1* | 5/2009 | Ferguson | G01B 11/18 73/800 |
| 2009/0285521 A1* | 11/2009 | Kunigami | G01L 5/226 385/13 |
| 2009/0297089 A1* | 12/2009 | Huang | G01L 9/0076 385/12 |
| 2010/0329602 A1* | 12/2010 | Shah | G02B 6/022 385/13 |
| 2011/0051123 A1* | 3/2011 | Kunigami | G01L 1/246 356/32 |
| 2014/0123764 A1* | 5/2014 | Abtahi | G01L 7/065 73/705 |
| 2016/0011066 A1* | 1/2016 | Taverner | G02B 6/02209 356/73.1 |
| 2016/0209208 A1* | 7/2016 | Tsai | G01B 11/18 |
| 2016/0320555 A1* | 11/2016 | Tsai | G02B 6/0218 |
| 2017/0146417 A1* | 5/2017 | LeBlanc | G02B 6/10 |
| 2018/0259371 A1* | 9/2018 | Muller | G01D 5/35316 |
| 2019/0079111 A1* | 3/2019 | Hung | G01P 15/093 |

FOREIGN PATENT DOCUMENTS

| | | | | |
|---|---|---|---|---|
| JP | H01-110217 | A | 4/1989 | |
| JP | 2000-111319 | A | 4/2000 | |
| JP | 2001-107615 | A | 4/2001 | |
| JP | 2003-322805 | A | 11/2003 | |
| JP | 2006-214844 | A | 8/2006 | |
| JP | 2007-024527 | A | 2/2007 | |
| JP | 2010-140501 | A | 6/2010 | |
| KR | 1020110123303 | | * 5/2012 | ............... G02B 6/00 |

* cited by examiner (a)

(b)

(a)

(b)

(a)

(b)

(c)

(a)

(b)

(c)

(a)

(b)

(a)

(b)

(c)

(d)

OPENING AND CLOSING DETECTION SENSOR

TECHNICAL FIELD

The present invention relates to a sensor that detects opened and closed states of a manhole cover, a door, and the like, and particularly relates to an opening and closing detection sensor using an optical fiber having a fiber Bragg grating (FBG).

BACKGROUND ART

From a viewpoint of enhancing security, sensors have been conventionally installed on manhole covers, doors, and the like to detect opened and closed states thereof. As an opening and closing detection sensor of this kind, an optical fiber is used in recent years (for example, a patent document 1 to a patent document 4 and any others). The opening and closing detection sensors using the optical fiber can simultaneously monitor the opened and closed states of a plurality of objects to be detected by connecting in series the sensors installed in a plurality of objects to be detected respectively. Also, since no power feeding to each sensor is necessary, no wiring for power feeding to each sensor is necessary. Thus, the opened and closed states of many objects to be detected, such as manhole covers in sewer lines provided in urban areas, and doors of server racks storing servers in data centers, can be relatively easily monitored simultaneously. Such opening and closing detection sensor has a configuration where the optical fiber is deformed in response to a change of the opened and closed states in the cover or the door, and detects the opened and closed states of the object to be detected by using the change of a reflection state or a scattering state of light transmitted into the optical fiber in response to the deformation of the optical fiber.

CITATION LIST

Patent Documents

Patent document 1: Japanese Unexamined Patent Application Publication No. 2003-322805
Patent document 2: Japanese Unexamined Patent Application Publication No. 2007-024527
Patent document 3: Japanese Unexamined Patent Application Publication No. H01-110217
Patent document 4: Japanese Unexamined Patent Application Publication No. 2010-140501

SUMMARY OF INVENTION

Problems to be Solved by Invention

As known, when an ambient temperature changes, the optical fiber is deformed by its expansion or contraction, and a refractive index of the optical fiber varies. Thus, the reflection state or the scattering state of light transmitted into the optical fiber, e.g. an output value of the sensor, changes in response to the ambient temperature. The change of the output value of the sensor due to the temperature change needs relatively long time because the deformation and the refractive index variation of the optical fiber occur with the temperature change. Thus, a time rate of change of a sensor output value which is smaller than a predetermined threshold has been conventionally determined that the opened and closed states of the object to be detected are not changed by identifying as the change of the sensor output value due to the temperature change.

However, when the opened and closed states of the object to be detected are changed extremely slowly, the sensor output value changes slowly as well. That is, the opened and closed states of the object to be detected are changed in a state where the time rate of change of the sensor output value is smaller than the above threshold, such change of the opened and closed states is determined as the change of the sensor output value due to the temperature change, thereby being unable to be detected.

When a frequency of the change of the opened and closed states of the object to be detected is extremely low, a shape of the optical fiber is fixed in a shape being kept for a long period of time. For example, when opening and closing of a manhole cover is detected, assuming that an external force is added to the optical fiber in the closed state, and the external force is released in the opened state. In this case, since the manhole cover is kept in the closed state for a long period of time, the optical fiber is kept under a state being deformed by the external force for a long period of time. Under this circumstance, if the manhole cover becomes the opened state and the external force added to the optical fiber is released, the shape of the optical fiber is fixed in the shape of the closed state by keeping the closed state for a very long period of time, and thereby the optical fiber may have difficulty in recovering its original shape. When such circumstance occurs, the change of the opened and closed states cannot be accurately detected, and thereby detection sensitivity is decreased.

The present invention is designed in view of such problems of the conventional arts, and an object of the present invention is to provide an opening and closing detection sensor capable of certainly detecting the change of the opened and closed states, when the opened and closed states of the object to be detected are changed extremely slowly, and when a frequency of the change of the opened and closed states is extremely low.

Solution to Problem

The present invention adopts following technical methods to attain the above-described object. First, the present invention is based on an opening and closing detection sensor using an optical fiber. The opening and closing detection sensor in accordance with the present invention includes a first base member, a second base member, the optical fiber, and a moving member. The second member is disposed so as to be movable relative to the first base member. The optical fiber includes a fiber Bragg grating (FBG) part where a Bragg wavelength varies in response to an interval between the first base member and the second base member. The moving member moves between a first position that corresponds to either one of an opened state and a closed state of the object to be detected and a second position that corresponds to the other state according to opening and closing of an object to be detected. Further, the moving member includes a locking part. The locking part abuts on the second base member between a third position, which is located between the first position and the second position, and the second position, thereby moving the second base member together with the moving member, and moving the second base member in a direction being separated from the first base member.

According to the opening and closing detection sensor of the present invention, the moving member moves according the opening and closing of the object to be detected, and when the moving member reaches a specific position (the third position), tension is instantaneously applied to the FBG part, or the tension which has been applied to the FBG part is instantaneously released. Thus, when the opened and closed states of the object to be detected are changed extremely slowly, the changes of the opened and closed states can be certainly detected as shifts of the Bragg wavelengths.

In this opening and closing detection sensor, for example, a configuration where a portion which includes the FBG part of the optical fiber is linearly disposed, and the second base member and the moving member move along an axis direction of the linearly disposed optical fiber can be adopted.

Also, a configuration where an energizing member, which gives an energizing force in a direction from the first position toward the second position, is further included can be adopted. Further, a configuration where the moving member has an abutment part which abuts on the object to be detected can be adopted. In the above configurations, a configuration where the moving member is configured by a hollow member, and the first base member, the second base member, and the optical fiber are disposed inside the moving member can be adopted. Additionally, under a circumstance where the first base member comes into contact with the second base, a configuration where the optical fiber is fixed on the first base member and the second base member in a state where a compression force is given along the axis direction of the optical fiber can be adopted. A configuration where an FBG part for temperature compensation is further installed on the first base member can be adopted.

Effect of Invention

According to the present invention, when the opened and closed states of the object to be detected are changed extremely slowly, and when a frequency of the change of the opened and closed states is extremely low, the change of the opened and closed states can be certainly detected.

DESCRIPTION OF EMBODIMENTS

Figure 1:
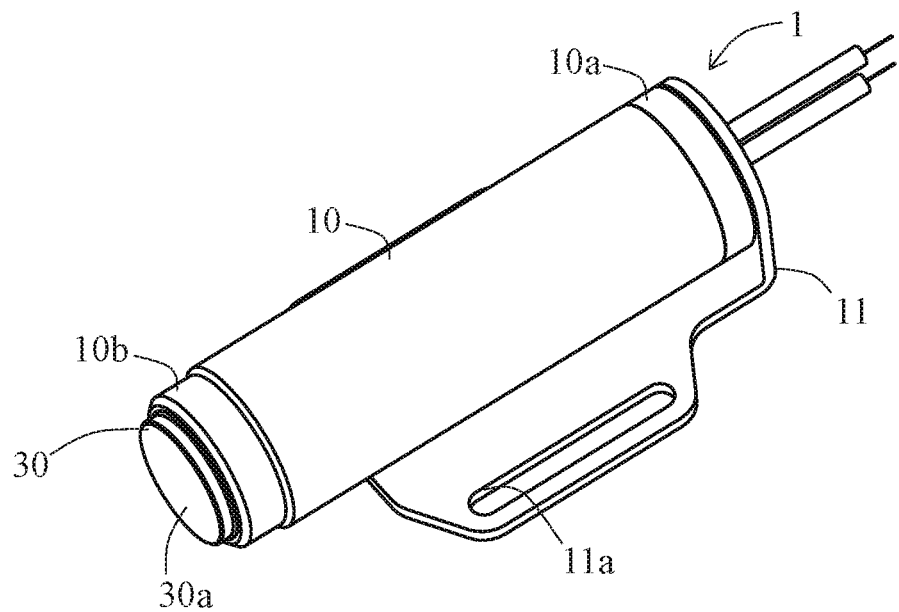
FIG. 1 (a) and FIG. 1 (b) show an example of a configuration of an opening and closing detection sensor in accordance with one embodiment of the present invention.
Figure 1:
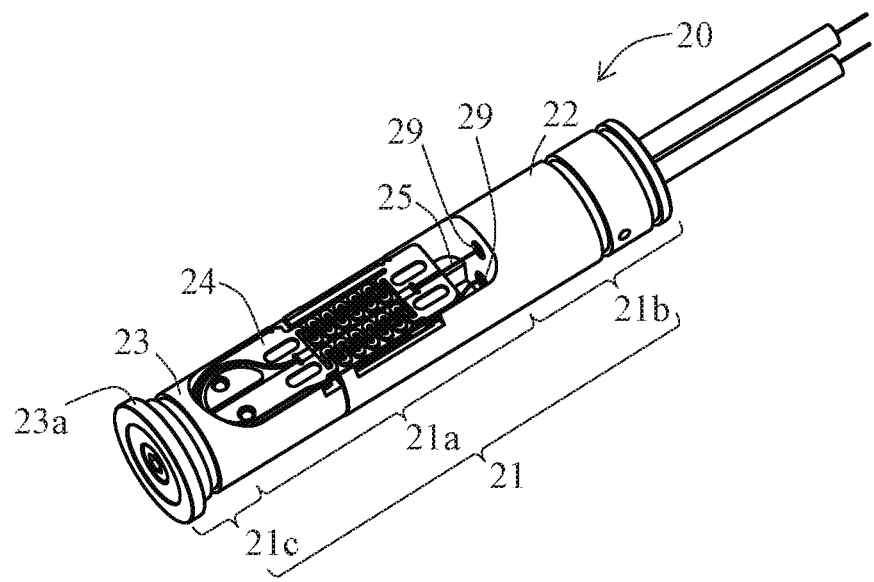

More detailed descriptions of embodiments of the present invention are provided below with reference to the drawings. FIG. 1 (a) and FIG. 1 (b) show an example of a configuration of an opening and closing detection sensor in accordance with an embodiment. FIG. 1 (a) is a schematic view showing an outward appearance of an opening and closing detection sensor 1 in accordance with this embodiment. FIG. 1 (b) is a schematic view showing an internal configuration of the opening and closing detection sensor 1 in accordance with this embodiment.

As shown in FIG. 1 (a) and FIG. 1 (b), the opening and closing detection sensor 1 has a configuration where a sensor part 20 and a moving member 30 are disposed in a cylindrical case 10 where one side of open ends is closed. A fixture 11, which is cross-sectionally L-shaped, is fixed on a closed side of an end part 10a (hereinafter referred to as "a base end part 10a"). The opening and closing detection sensor 1 is fixed to a desired object with a screw or the like that is inserted in a through groove 11a provided in the fixture 11. In this example, the through groove 11a is formed along an axial direction of the case 10, and an adjustment of disposition along the axial direction is possible when the opening and closing detection sensor 1 is fixed to the object. In this embodiment, an outer diameter of the case 10 is about 30 mm and a total axial length thereof is about 80 mm, but is not particularly limited thereto.

The moving member 30 is disposed so as to freely move in and out at a leading end part 10b of the case 10. The moving member 30 is configured by a cylindrical member, and a part of the moving member that moves in and out of the leading end part 10b of the case 10 has an outer diameter that matches an inner diameter of the leading end part 10b. An open end side of the moving member 30 exposing outward of the case 10 is closed with a lid member made of resin such as rubber, and the lid member configures an abutment part 30a that abuts on the object to be detected.

Figure 3:
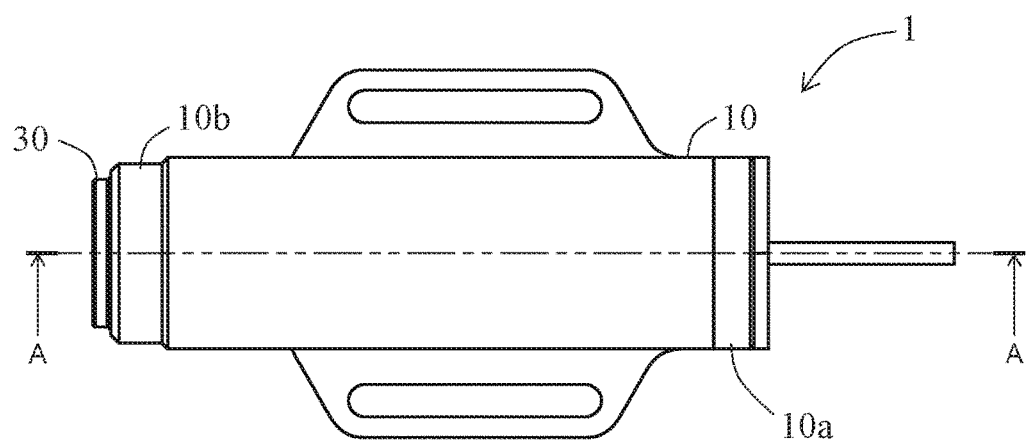
FIG. 3 (a) to FIG. 3 (c) show a relation between a moving member and a moving base of the opening and closing detection sensor in accordance with one embodiment of the present invention.
Figure 3:
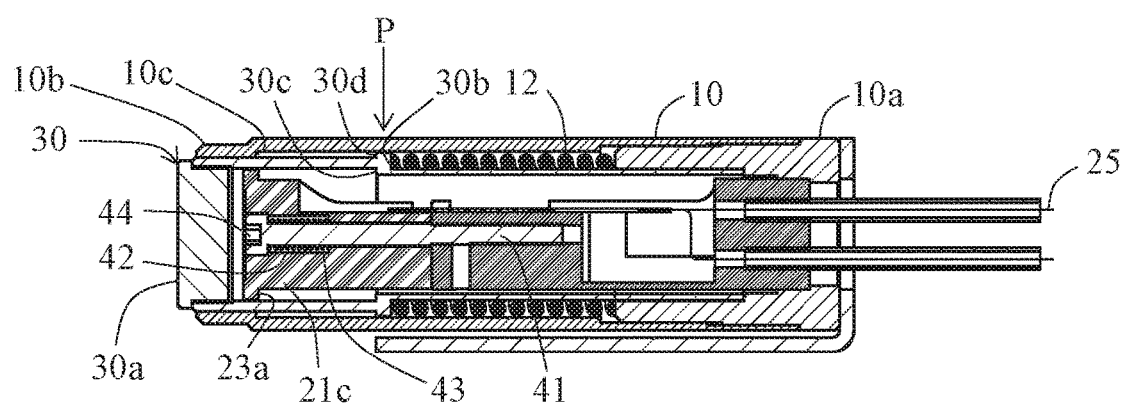
Figure 3:
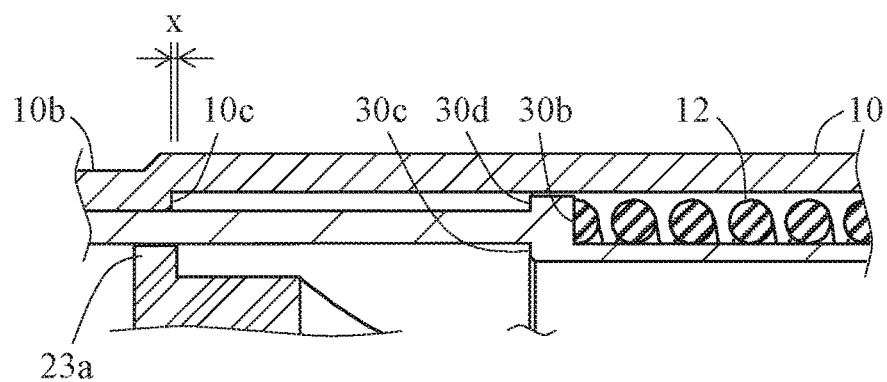

Also, the moving member 30 is energized along an axis of the case 10 in a direction from the base end part 10a toward the leading end part 10b. As shown in FIG. 3 (b) and FIG. 4 (b) as described below, in this embodiment, an outer diameter of a part of the moving member 30 housed inside the case 10 is smaller than an outer diameter of a part which moves in and out of the leading end part 10b of the case 10. Also, an inner diameter of a part of the case 10 facing the part of the moving member 30 having a smaller outer diameter is larger than an inner diameter of the leading end part 10*b*. With such a configuration, inside the case 10, a ring-shaped space is formed between an outer circumferential surface of the moving member 30 and an inner circumferential surface of the case 10. In this embodiment, a helical spring 12 is disposed in this space as an energizing member on the same axis as the case 10. One end of the helical spring 12 abuts on the base end part 10*a* of the case 10, and the other end abuts on a level difference 30*b* formed on the outer circumferential surface of the moving member 30.

For example, when an object to be detected is a manhole cover, the opening and closing detection sensor 1 in this embodiment is disposed in a state where the axis of the case 10 is perpendicular to a back surface of the manhole cover (a surface of a manhole side) in a closed state. At this time, the abutment part 30*a* comes into contact with the back surface of the manhole cover, and the moving member 30 is in a state of being pushed into the inside of the case 10 by resisting an energizing force of the helical spring 12. In this case, when the manhole cover in the closed state changes to an opened state, the moving member 30 becomes a projecting state by projecting from the leading end part 10*b* of the case 10 toward the outside in the axis direction by the energizing force of the helical spring 12. The opening and closing detection sensor 1 detects opened and closed states of the object to be detected by detecting such movement of the moving member 30. A length of the moving member 30 along the axial direction of the case 10 is set so as not to interfere with the base end part 10*a* of the case 10 when the moving member 30 is pushed into the inside of the case 10 (see FIG. 3 (*b*) and FIG. 4 (*b*)).

As shown in FIG. 1 (*b*), the sensor part 20 includes a base member 21 that is formed by being connected with columnar parts 21*b* and 21*c* on both sides in an axis direction of a semicolumnar part 21*a*, a sensor base 24 fixed to the semicolumnar part 21*a*, and an optical fiber 25 fixed on the sensor base 24. In this embodiment, the base member 21 is formed by cutting a center portion of the columnar-shaped member made of stainless steel into a semicolumnar shape, but in not particularly limited thereto.

The base member 21 has a fixed base 22 (a first base member) fixed to the case 10, and a moving base 23 (a second base member) being movable relative to the fixed base 22. In this embodiment, the base member 21 is divided into the fixed base 22 and the moving base 23 along a surface perpendicular to the axis of the case 10 in the semicolumnar part 21*a*. In this embodiment, the base end part 10*a* side is the fixed base 22, and the leading end part 10*b* side is the moving base 23. Also, in the columnar part 21*b* of the fixed base 22, a through hole 29 is formed to lead out the optical fiber 25 to the outside of the case 10.

Figure 2:
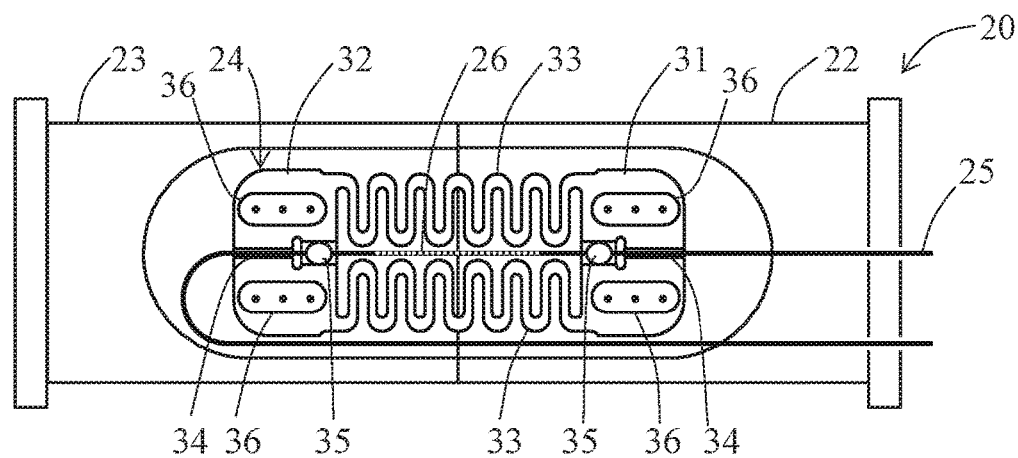
FIG. 2 (a) and FIG. 2 (b) show an example of a configuration of a sensor part provided in the opening and closing detection sensor in accordance with one embodiment of the present invention.
Figure 2:
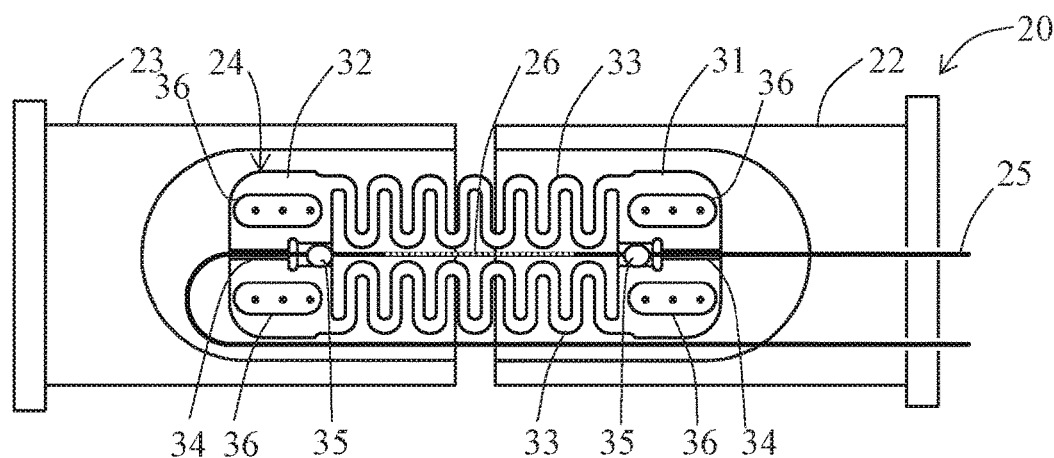

FIG. 2 (*a*) and FIG. 2 (*b*) show an example of a configuration of the opening and closing detection sensor 1 in accordance with this embodiment. FIG. 2 (*a*) is a schematic view showing a state where the moving base 23 comes into contact with the fixed base 22. FIG. 2 (*b*) shows a state where the moving base 23 is separated from the fixed base 22. An interval between the moving base 23 and the fixed base 22 is about several tens of micrometers, but relatively larger interval is shown in FIG. 2 (*b*) for explanation.

As shown in FIG. 1 (*b*), FIG. 2 (*a*), and FIG. 2 (*b*), the sensor base 24 fixes and supports the optical fiber 25 having a fiber Bragg grating (FBG) part 26. As the sensor base 24 and the optical fiber 25 configure a strain gauge, when the moving base 23 moves relative to the fixed base 22, this movement is outputted as a variation of a Bragg wavelength. The variation of the Bragg wavelength can be obtained by a conventional method by using a measuring instrument connected to an end part of the optical fiber 25.

The sensor base 24 in this embodiment has a configuration where two plate parts 31 and 32 are disposed facing along the axis direction of the case 10, and both ends in width directions of the plate parts 31 and 32 are coupled with two meandered elastic parts 33, but the configuration is not limited thereto. The plate parts 31 and 32 have grooves 34 along the axis direction of the case 10, and the optical fiber 25 is housed in the grooves 34. At this time, in a state where the FBG part 26 is disposed between the plate part 31 and the plate part 32, the optical fiber 25 in both sides of the FBG part 26 is fixed to the plate part 31 and the plate part 32 respectively with a fixing agent 35 such as an adhesive. A material of the sensor base 24 is not specifically limited. For example, it may be resin or metal. The sensor base 24 herein is comprised of stainless steel.

The FBG part 26 reflects light with a wavelength defined by the Bragg wavelength. The FBG part 26 is configured with a plurality of diffraction gratings disposed at a predetermined interval in a core of the optical fiber 25, and the Bragg wavelength is proportional to a product of a refractive index of the optical fiber and a disposition interval of the diffraction grating. Thus, when the intervals of the diffraction gratings expand with the FBG part 26 being pulled, the wavelength of light reflected by the FBG part 26 becomes larger. In other words, the wavelength of the light reflected by the FBG part 26 varies in response to the interval between the moving base 23 and the fixed base 22, and the wavelength of light reflected by the FBG part 26 is larger in the state where the moving base 23 is separated from the fixed base 22 (a state in FIG. 2 (*b*)), compared with the state where the moving base 23 is in contact with the fixed base 22 (a state in FIG. 2 (*a*)). The FBG part 26 is shown in black-and-white stripe in the drawings for convenience.

Any known methods such as the adhesive or spot welding can be used for fixing the sensor base 24 to the fixed base 22 and the moving base 23. In this embodiment, since the fixed base 22, the moving base 23, and the sensor base 24 are comprised of stainless steel, the sensor base 24 is fixed to the fixed base 22 and the moving base 23 with the spot welding. As shown in FIG. 2 (*a*) and FIG. 2 (*b*), the plate parts 31 and 32 have recessed parts 36 for the spot welding in this embodiment. The recessed parts 36 are disposed in both sides of the above-described grooves 34, and bottom parts of the recessed parts 36 configure thin-walled parts for the spot welding.

Figure 4:
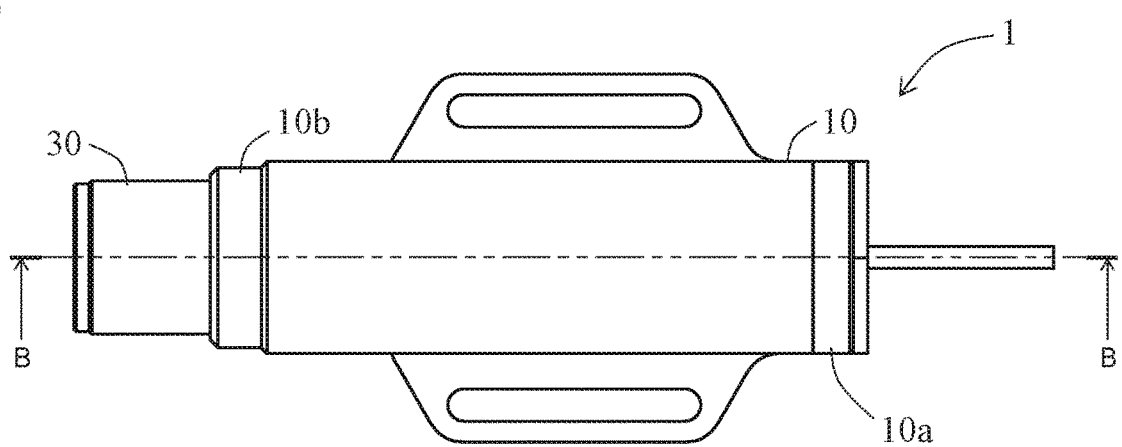
FIG. 4 (a) to FIG. 4 (c) show a relation between the moving member and the moving base provided in the opening and closing detection sensor in accordance with one embodiment of the present invention.
Figure 4:
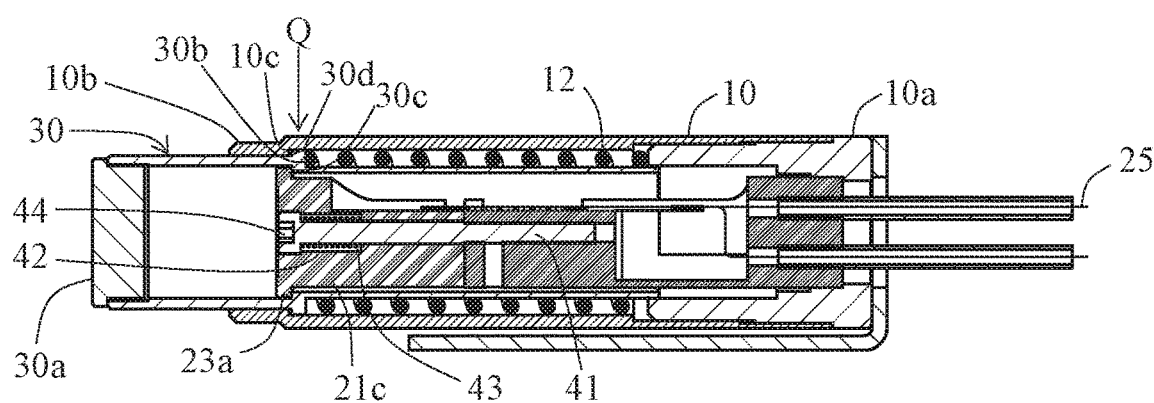
Figure 4:
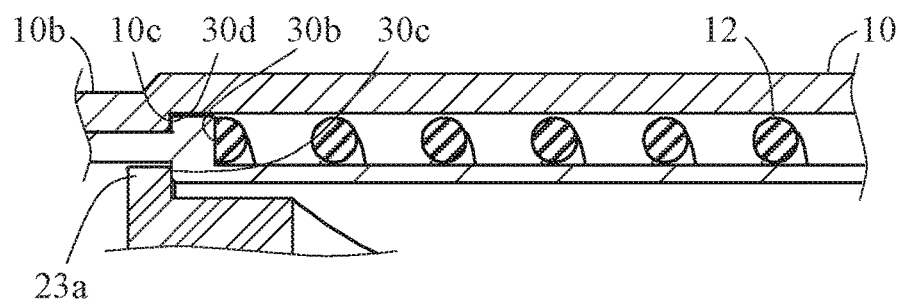

FIG. 3 (*a*) to FIG. 3 (*c*) and FIG. 4 (*a*) to FIG. 4 (*c*) show a relation between the moving member 30 and the moving base 23 of the opening and closing detection sensor 1 in this embodiment. FIG. 3 (*a*) shows a state that the moving member 30 of the opening and closing detection sensor 1 is pushed into the case 10. FIG. 3 (*b*) is a cross-sectional view taken along line A-A of FIG. 3 (*a*). FIG. 3 (*c*) is an enlarged view of around arrow portion P of FIG. 3 (*b*). FIG. 4 (*a*) shows a state that the moving member 30 of the opening and closing detection sensor 1 projects from the case 10. FIG. 4 (*b*) is a cross-sectional view taken along line B-B of FIG. 4 (*a*). FIG. 4 (*c*) is an enlarged view of around arrow portion Q of FIG. 4 (*b*). As described above, since the interval between the moving base 23 and the fixed base 22 is about several tens of micrometers, unlike FIG. 2 (*b*), in FIG. 4 (*b*) the interval is not shown.

The opening and closing detection sensor 1 in this embodiment is installed in either one of the opened state and the closed state of the object to be detected that corresponds to a state shown in FIG. 3 (*a*) to FIG. 3 (*c*), and the other state corresponds to a state shown in FIG. 4 (a) to FIG. 4 (c). When the object to be detected is the manhole cover as above-described example, FIG. 3 (a) to FIG. 3 (c) correspond to the closed state and FIG. 4 (a) to FIG. 4 (c) correspond to the opened state. For the purpose of explanation, the state of the opening and closing detection sensor 1 shown in FIG. 3 (a) to FIG. 3 (c) is defined as an on-state, and the state thereof shown in FIG. 4 (a) to FIG. 4 (c) is defined as an off-state below.

As shown in FIG. 3 (b) and FIG. 4 (b), in the end part of the moving member 30 side of the columnar part 21c in the moving base 23, a flange 23a is formed over a whole part in a circumferential direction. Meanwhile, a locking part 30c engaging with the flange 23a is provided on an inner circumferential surface of the moving member 30. In this embodiment, the locking part 30c is formed over a whole part in the circumferential direction. Also, on an outer circumferential surface of the moving member 30, a level difference 30d that functions as a stopper is provided between the level difference 30b and abutment part 30a. As shown in FIG. 3 (b) and FIG. 4 (b), in this embodiment, the level difference 30b and the level difference 30d are both ends of a projection formed over a whole outer circumferential part in the moving member 30. The level difference 30d abuts on the level difference 10c formed on an inner circumferential surface of the case 10, thereby preventing the moving case 30 from separating from the leading end part 10b of case 10. In this embodiment, the level difference 30d and the locking part 30c are at the same position in the axis direction of the case 10, but not specifically limited thereto. Also, the level difference 10c is positioned in the abutment part 30a side by a distance x from a position where the flange 23a firstly abuts on the locking part 30c in a transition process from the on-state to the off-state.

As shown in FIG. 3 (b), in the on-state, the moving member 30 is in a state of being pushed into the case 10. In this case, the locking part 30c is positioned where it does not come into contact with the flange 23a (a first position), and the moving base 23 is held in a state of coming into contact with the fixed base 22, for example, by an elastic force of the elastic parts 33 in the sensor base 24. In this embodiment, as shown in FIG. 3 (b), an energizing member to energize the moving base 23 toward the fixed base 22 is further provided. As shown in FIG. 3 (b), a columnar rail 41 that regulates a moving direction of the moving base 23 is fixed on the fixed base 22, and the moving base 23 has a through hole 42 that fits to the rail 41. An end part of the through hole 42 has a wide inner diameter, and space is formed between the through hole 42 and the rail 41. A helical spring 43 is disposed as the energizing member in the space. A bolt 44 for retaining is screwed to an end part of the rail 41 on the moving base 23 side, and one end of the helical spring 43 abuts on the bolt 44. Since an energizing force of the helical spring 43 is smaller than that of the helical spring 12, the movement of the moving member 30 is not interfered when the moving member 30 changes from the on-state to the off-state.

As shown in FIG. 4 (b), in the off-state, the moving member 30 is in a state of projecting outward in the axis direction of the case 10. In the process of changing from the on-state to the off-state, the locking part 30c abuts on the flange 23a (a third position) accompanied by the movement of the moving member 30. Then, the moving member 30 further moves to a position where the level difference 30d on the outer circumferential surface abuts on the level difference 10c on the inner circumferential surface of the case 10 (a second position). At this time, after the locking part 30c abuts on the flange 23a, the moving base 23 moves accompanied by the movement of the moving member 30 during a time period until the level difference 30d abuts on the level difference 10c. In other words, accompanied by the movement of the moving member 30, the moving base 23 is made to move in a direction separating from the fixed base 22. In this embodiment, as described above, the level difference 10c is positioned on the abutment part 30a side only by the distance x from the position where the flange 23a firstly abuts on the locking part 30c, and thereby the moving base 23 is separated only by the distance x from the fixed base 22 when the moving member 30 becomes the off-state. For example, a moving amount of the moving base 23 for varying the Bragg wavelength of the FBG part 26 by 1 nm, which is enough to be detectable, is about 20 micrometers. Thus, the distance x can be set to several tens of micrometers. During the time period until the locking part 30c abuts on the flange 23a after the moving member 30 starts moving, the moving base 23 does not move when the moving member 30 moves.

Figure 5:
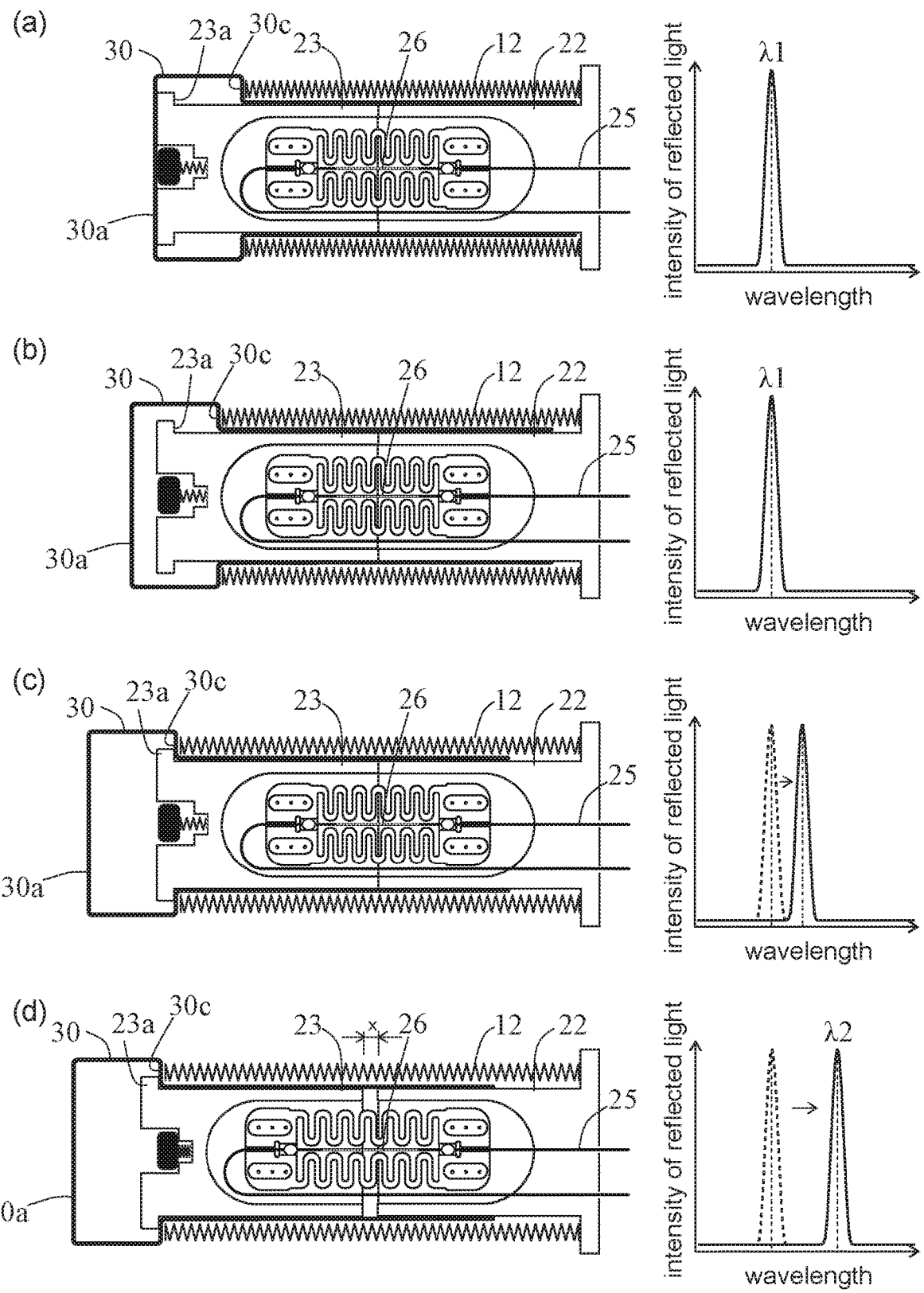
FIG. 5 (a) to FIG. 5 (d) show an example of a spectrum of reflected light of the opening and closing detection sensor in accordance with one embodiment of the present invention.

Subsequently, opening and closing detections by the opening and closing detection sensor 1 are described. FIG. 5 (a) to FIG. 5 (d) show spectrums of reflected light when wide-bandwidth light, including the Bragg wavelength of the FBG part 26, enters the optical fiber 25 in a process where the opening and closing detection sensor 1 changes from the on-state to the off-state (hereinafter referred to as "the reflected light spectrum"). FIG. 5 (a) corresponds to the on-state. FIG. 5 (b) corresponds to a time period until the locking part 30c abuts on the flange 23a after the opening and closing detection sensor 1 starts changing to the off-state. FIG. 5 (c) corresponds to a time period until the opening and closing detection sensor 1 becomes the off-state after the locking part 30c abuts on the flange 23a. FIG. 5 (d) corresponds to the off-state. In FIG. 5 (a) to FIG. 5 (d) showing the reflected light spectrum, horizontal axis corresponds to wavelength of the reflected light, and vertical axis corresponds to intensity of the reflected light. FIG. 5 (a) to FIG. 5 (d) also schematically show states of the sensor part 20 corresponding to each state. As with FIG. 2 (b), in FIG. 5 (d), the moving amount of the moving base 23 is illustrated larger for explanation.

In the on-state, as shown in FIG. 5 (a), the reflected light spectrum has its peak at a wavelength $\lambda 1$ that is the Brag wavelength of the FBG part 26. During the time period until the locking part 30c abuts on the flange 23a after starting the change to the off-state, as described above, the moving base 23 does not move. Thus, as shown in FIG. 5 (b), the reflected light spectrum has its peak at the Bragg wavelength $\lambda 1$ of the FBG part 26. During the time period until the opening and closing detection sensor 1 becomes the off-state after the locking part 30c abuts on the flange 23a, the moving base 23 moves in a direction separating from the fixed base 22 accompanied by the movement of the moving member 30. Thus, the Bragg wavelength of the FBG part 26 shifts toward larger wavelength accompanied by the movement of the moving member 30 as shown in FIG. 5 (c). When the opening and closing detection sensor 1 becomes the off-state, as shown in FIG. 5 (d), the reflected light spectrum has its peak at a wavelength $\lambda 2$ that is the Brag wavelength of the FBG part 26 corresponding to the distance x between the fixed base 22 and the moving base 23. In FIG. 5 (c) and FIG. 5 (d), the position of the peak before the variation is indicated by a dashed line.

Figure 6:
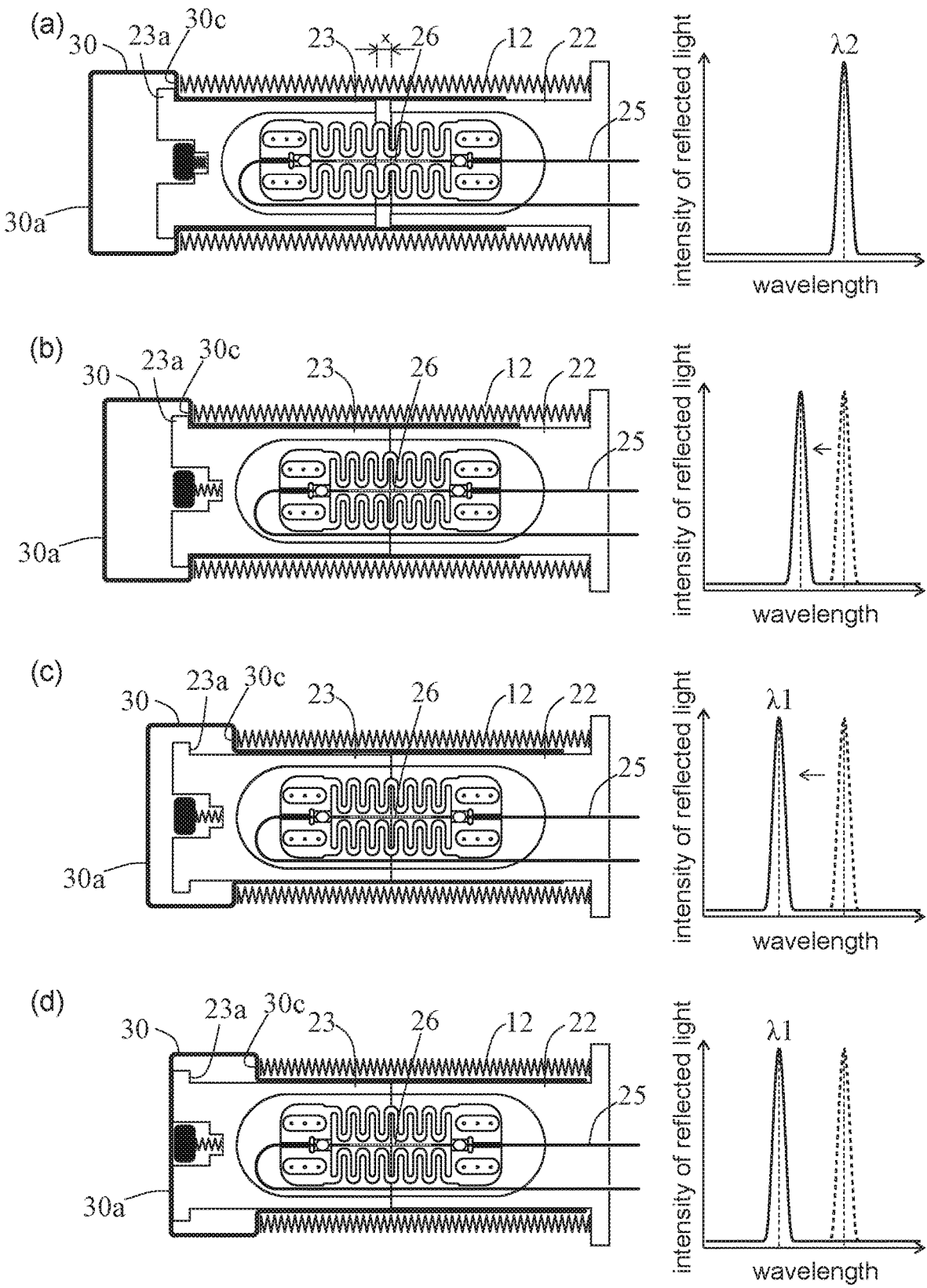
FIG. 6 (a) to FIG. 6 (d) show an example of the spectrum of reflected light of the opening and closing detection sensor in accordance with one embodiment of the present invention.

FIG. 6 (a) to FIG. 6 (d) show the reflected light spectrum when the wide-bandwidth light, including the Bragg wavelength of the FBG part 26, enters the optical fiber 25 in a process where the opening and closing detection sensor 1 changes from the off-state to the on-state. FIG. 6 (*a*) corresponds to the off-state. FIG. 6 (*b*) corresponds to a time period until the locking part 30*c* separates from the flange 23*a* after the opening and closing detection sensor 1 starts changing to the on-state. FIG. 6 (*c*) corresponds to a time period until the opening and closing detection sensor 1 becomes the on-state after the locking part 30*c* is separated from the flange 23*a*. FIG. 6 (*d*) corresponds to the on-state. In FIG. 6 (*a*) to FIG. 6 (*d*) showing the reflected light spectrum, horizontal axis corresponds to the wavelength of the reflected light and vertical axis corresponds to the intensity of the reflected light. FIG. 6 (*a*) to FIG. 6 (*d*) also schematically show states of the sensor part 20 corresponding to each state. As with FIG. 2 (*b*) and FIG. 5 (*d*), in FIG. 6 (*a*), the moving amount of the moving base 23 is shown larger for explanation.

In the off-state, as shown in FIG. 6 (*a*), the reflected light spectrum has its peak at the wavelength $\lambda 2$ that is the Brag wavelength of the FBG part 26 corresponding to the distance x between the fixed base 22 and the moving base 23. During the period until the locking part 30*c* is separated from the flange 23*a* after starting the change to the on-state, the moving base 23 moves toward the fixed base 22 accompanied by the movement of the moving member 30. Thus, the Bragg wavelength of the FBG part 26 shifts toward smaller wavelength according to the movement of the moving member 30 as shown in FIG. 6 (*b*). During the time period until the opening and closing detection sensor 1 becomes the on-state after the locking part 30*c* is separated from the flange 23*a*, the moving base 23 abuts on the fixed base 22 and does not move. Thus, as shown in FIG. 6 (*c*), the reflected light spectrum has its peak at the Bragg wavelength $\lambda 1$ of the FBG part 26. Since the moving base 23 is in a state of abutting on the fixed base 22 even in the on-state, as shown in FIG. 6 (*d*), the reflected light spectrum has its peak at the Bragg wavelength $\lambda 1$ of the FBG part 26. In FIG. 6 (*b*) to FIG. 6 (*d*), the positions of the peak before the variation are indicated by dashed lines.

Figure 7:
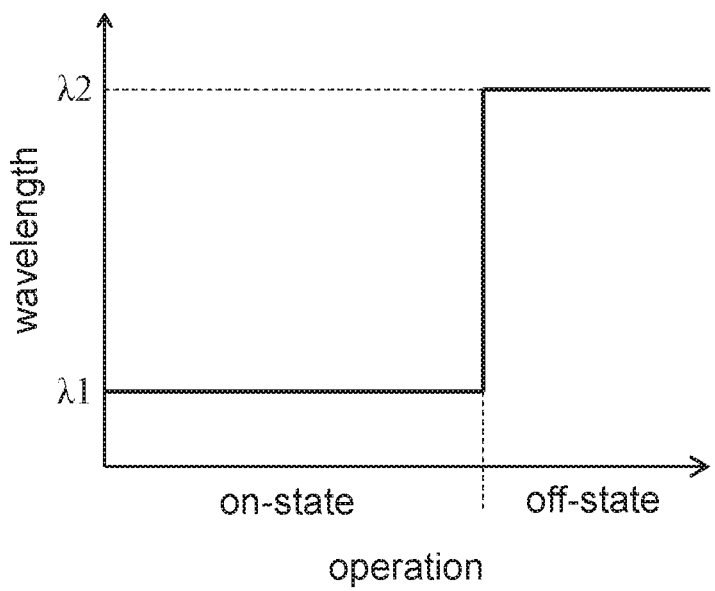
FIG. 7 (a) and FIG. 7 (b) show a relation between an operation state and a variation in the spectrum of reflected light of the opening and closing detection sensor in accordance with one embodiment of the present invention.
Figure 7:
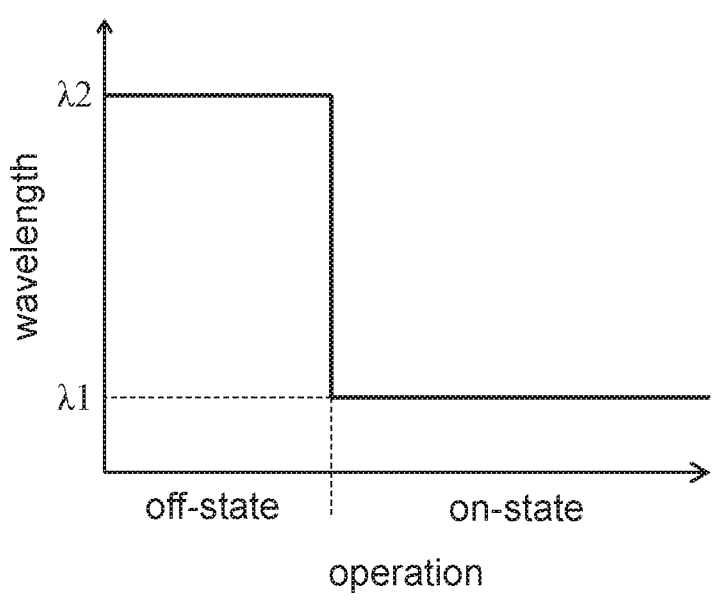

FIG. 7 (*a*) and FIG. 7 (*b*) show a relation between an operation state of the opening and closing detection sensor 1 and a variation in the peak wavelength in the reflected light spectrum as described above. FIG. 7 (*a*) shows a variation in the peak wavelength in the reflected light spectrum when the opening and closing detection sensor 1 changes from the on-state to the off-state, and FIG. 7 (*b*) shows a variation in the peak wavelength in the reflected light spectrum when changing from the off-state to the on-state. In FIG. 7 (*a*) and FIG. 7 (*b*), horizontal axis corresponds to changes of the operation state with time, and vertical axis corresponds to the peak wavelength.

When the opening and closing detection sensor 1 in this embodiment changes from the on-state to the off-state or from the off-state to the on-state, the Bragg wavelength of the FBG part 26 varies with a slight movement at a specific position (the position where the locking part 30*c* abuts on the flange 23*a*), and not with a whole movement of the moving member 30. The moving amount of the moving base 23 for varying the Bragg wavelength of the FBG part 26 is several tens of micrometers as described above. The moving amount of the moving base 23 is extremely small as compared with the moving amount of the moving member 30 (for example, about 10 mm), and thereby the Bragg wavelength varies in an extremely short period of time. Thus, as shown in FIG. 7 (*a*) and FIG. 7 (*b*), the Bragg wavelength of the FBG part 26 varies instantaneously (stepwise) at a timing of passage of the moving member 30 through the specific position.

According to the opening and closing detection sensor 1 having such configuration as above, the moving member 30 moves accompanied by the opening and closing of the object to be detected, and when the moving member 30 reaches the specific position, tension is instantaneously applied to the FBG part 26, or tension applied to the FBG part 26 is instantaneously released. Thus, when the opened and closed states of the object to be detected are changed extremely slowly, the change of the opened or closed state can be certainly detected as the stepwise shift of the Bragg wavelength.

When the opening and closing detection sensor 1 is in either one of the on-state and the off-state, an external force acting on the optical fiber 25 is extremely small so that a detection sensitivity of the optical fiber 25 is hardly lowered due to a fixation of a shape thereof even when the on-state or the off-state continues over a long period of time.

In recent years, a strain gauge using an optical fiber having an FBG part widely adopts a configuration where the optical fiber is fixed on and supported by a sensor base in a state where tension along an axis direction of the optical fiber (pretension) is applied to the FBG part. Such configuration where the tension is applied to the FBG part allows the strain gauge to detect stress in a compression direction as well as stress in a tensile direction. Also, in this embodiment, under the state where the moving base 23 comes into contact with the base 22, a configuration where the optical fiber 25 is fixed to the sensor base 24 can be adopted in the state where the tension along the axis direction of the optical fiber is applied to the FBG part 26.

By adopting such configuration, when vibration is generated in the moving base 23 due to vibration generated from the moving member 30 in moving inside the case 10, the FGB part 26 accidentally detects such vibration as well. As a result, noise may be superimposed on the variation of the Bragg wavelength when the opening and closing detection sensor 1 changes from the on-state to the off-state, or from the off-state to the on-state.

By setting a threshold to distinguish the on-state from the off state, the opened and closed states can be detected under such circumstances. However, from a viewpoint of avoiding such superimposed noise, under the state where the moving base 23 comes into contact with the base 22, a configuration where the optical fiber 25 is fixed to the sensor base 24 is preferably adopted in a state where the compression force along the axis direction of the optical fiber (the force in a direction where the interval between the diffraction gratings is narrowed) is applied to the FBG part 26, or in a state where tension is not substantially applied to the FBG part 26. By adopting such configuration, data of the variation of the Bragg wavelength without the superimposed noise can be obtained.

Figure 8:
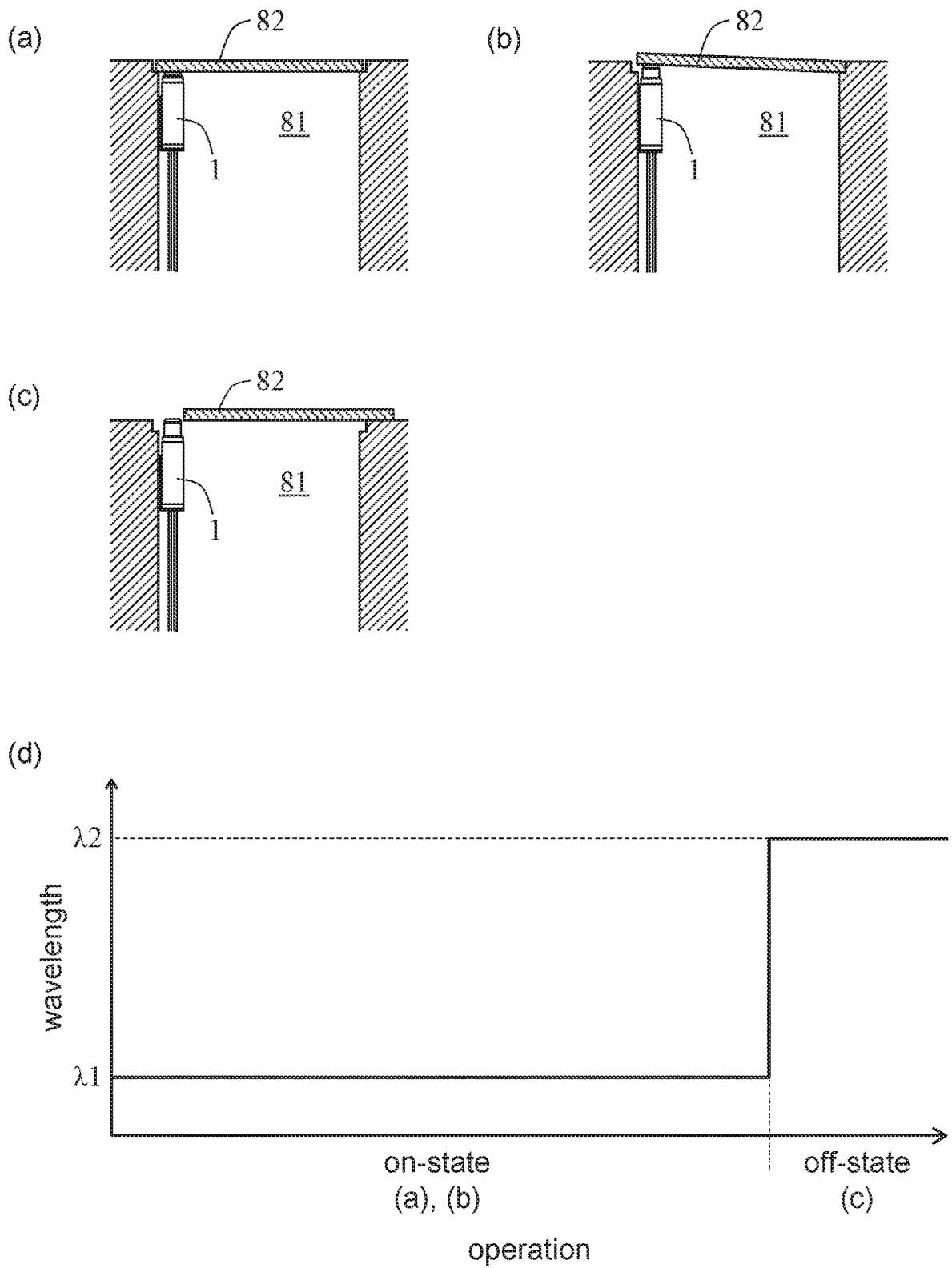
FIG. 8 (a) to FIG. 8 (d) show an applicable example of the opening and closing detection sensor in accordance with one embodiment of the present invention.

FIG. 8 (*a*) to FIG. 8 (*d*) show an example of application of the opening and closing detection sensor 1 to detect opened and closed states of a manhole cover. FIG. 8 (*a*) is a schematic view showing the manhole cover in the closed state. FIG. 8 (*b*) is a schematic view showing the manhole cover in a transition process from the closed state to the opened state. FIG. 8 (*c*) is a schematic view showing the manhole cover in the opened state. Further, FIG. 8 (*d*) is a schematic view showing the variation of the Bragg wavelength of the FBG part 26 associated with the change in the closed and opened states as shown in FIG. 8 (*a*) to FIG. 8 (*c*). FIG. 8 (*a*) to FIG. 8 (*c*) illustrate cross sections of the manhole covers and manholes, and the side of the opening and closing detection sensors 1.

As shown in FIG. 8 (a), the opening and closing detection sensor 1 is disposed in a state where the axis of the case 10 is perpendicular to a back surface of a manhole cover 82 (a surface of a manhole 81 side) in the closed state. At this time, the abutment part 30a comes into contact with the back surface of the manhole cover 82. In this state, the moving member 30 is in the state of being pushed into the case 10. Thus, the moving base 23 abuts on the fixed base 22, and the Bragg wavelength of the FBG part 26 is at the wavelength λ1 in response to such state. As shown in FIG. 8 (b), when the manhole cover 82 is in the transition process from the closed state to the opened state, during the time period until the locking part 30c abuts on the flange 23a, the Bragg wavelength of the FBG part 26 remains at the wavelength λ1 because the moving base 23 abuts on the fixed base 22. When the locking part 30c abuts on the flange 23a, the moving base 23 is separated by the distance x from the fixed base 22, and thereby the Bragg wavelength of the FBG part 26 instantaneously becomes at the wavelength λ2 in response to such state. As shown in FIG. 8 (c), when the manhole cover 82 is in the opened state, the Bragg wavelength of the FBG part 26 remains at the wavelength λ2 because the interval between the moving base 23 and the fixed base 22 is the distance x.

Figure 9:
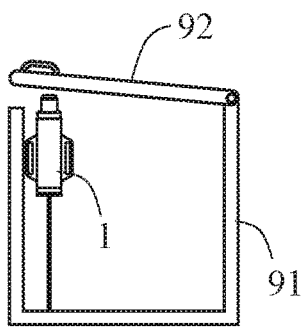
FIG. 9 (a) to FIG. 9 (d) show an applicable example of the opening and closing detection sensor in accordance with one embodiment of the present invention.
Figure 9:
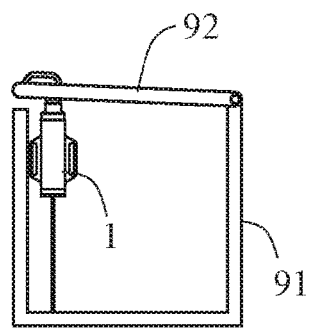
Figure 9:
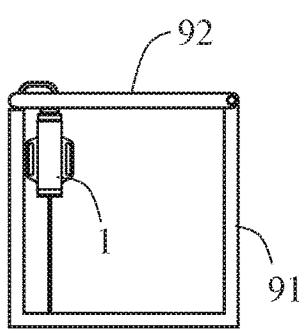
Figure 9:
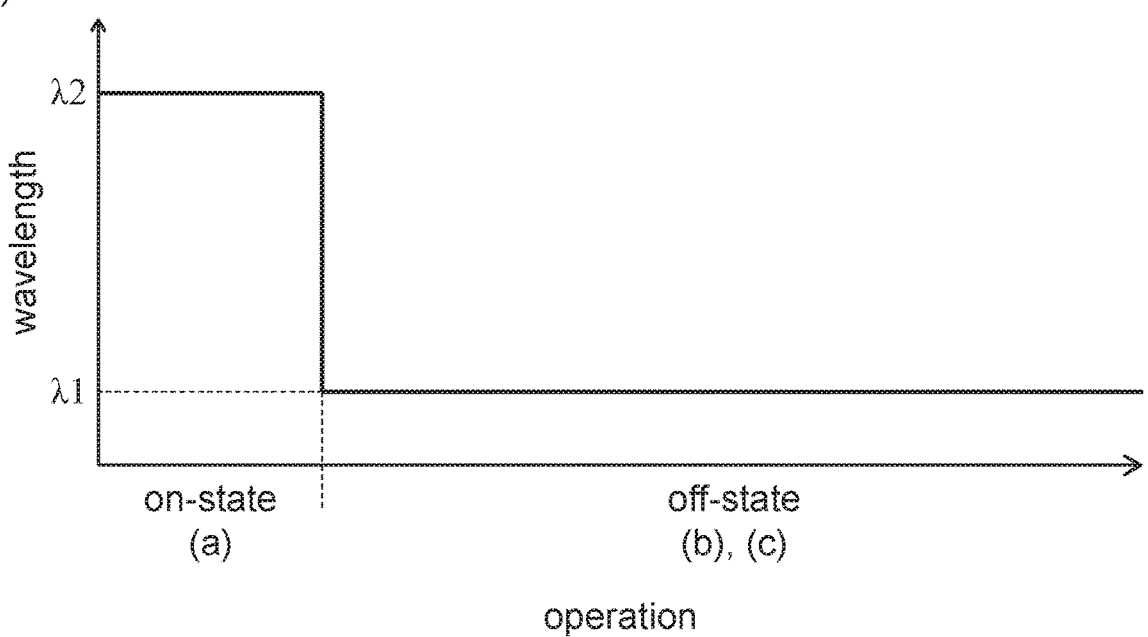

FIG. 9 (a) to FIG. 9 (d) show an example of application of the opening and closing detection sensor 1 to detect opened and closed states of a hinged door. Since the opening and closing detection relating to the operation from the closed state to the opened state is similar to the example of the manhole cover as shown in FIG. 8 (a) to FIG. 8 (d), here, the operation from the opened state to the closed state is described. FIG. 9 (a) is a schematic view showing the hinged door in the opened state. FIG. 9 (b) is a schematic view showing the hinged door in a transition process from the opened state to the closed state. FIG. 9 (c) is a schematic view showing the hinged door in the closed state. Further, FIG. 9 (d) is a schematic view showing the variation of the Bragg wavelength of the FBG part 26 associated with the change in the opened and closed states as shown in FIG. 9 (a) to FIG. 9 (c). FIG. 9 (a) to FIG. 9 (c) show the hinged door provided in a server rack when viewed from above, and omit illustrations of a top board and an inside configuration of the server rack. The opening and closing detection sensor 1 is installed on a bottom board of the server rack.

As shown in FIG. 9 (c), the opening and closing detection sensor 1 is disposed in a state where the axis of the case 10 is perpendicular to a back surface of a hinged door 92 (an inside surface in a server rack 91) in the closed state. At this time, the abutment part 30a comes into contact with the back surface of the hinged door 92. Meanwhile, when the hinged door 92 is in the opened state, the abutment part 30a is separated from the back surface of the hinged door 92, and the moving member 30 projects from the leading end part 10b of the case 10 to the outside in the axis direction. At this time, the moving base 23 is separated by distance x from the fixed base 22, and thereby the Bragg wavelength of the FBG part 26 is at the wavelength λ2 in response to such state. As shown in FIG. 9 (b), when the hinged door 92 is in the transition process from the opened state to the closed state, during the time period until the moving member 30 is pushed into the inside of the case 10 and the locking part 30c separates from the flange 23a after the hinged door 92 abuts on the abutment part 30a, the Bragg wavelength of the FBG part 26 remains at the wavelength λ2 because the moving base 23 is separated by the distance x from the fixed base 22. When the locking part 30c separates from the flange 23a, the moving base 23 abuts on the fixed base 22, and thereby the Bragg wavelength of the FBG part 26 becomes at the wavelength λ1 in response to such state. After that, as shown in FIG. 9 (c), although the hinged door 92 is in the closed state, the Bragg wavelength of the FBG part 26 remains at the wavelength λ1 because the moving base 23 keeps on abutting on the fixed base 22.

As described above, the Bragg wavelength is defined by the refractive index of the optical fiber and the grating interval between the diffraction gratings. Thus, the Bragg wavelength varies with a variation of the refractive index due to a change in temperature, or with expansion and contraction of the optical fiber. Thereby, when abrupt temperature change occurs, a possibility of being unable to determine whether the variation of the Bragg wavelength occurs due to the movement of the moving base 23 or the temperature change is not denied.

Figure 10:
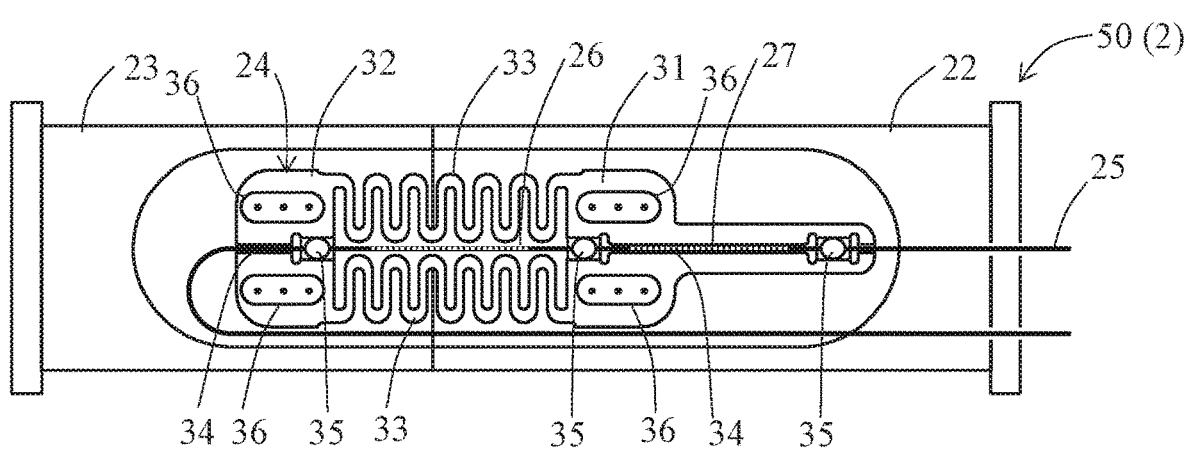
FIG. 10 shows another example of a configuration of a sensor part provided in an opening and closing detection sensor in accordance with one embodiment of the present invention.

As a measure for the above, an FBG part for correcting temperature can be disposed. FIG. 10 shows a configuration of a sensor part 50 provided in another opening and closing detection sensor 2 in accordance with this embodiment. The configuration of the sensor part 50 differs from that of the sensor part 20 of the opening and closing detection sensor 1 on the point that the sensor part 50 has the additional FBG part 27 for correcting the temperature. Other configurations are the same as that of the sensor part 20, and the same reference sign is used for the same component having the same function and effect.

As shown in FIG. 10, the FBG part 27 for correcting the temperature can be fixed on a plate part 31 fixed on a fixed base 22. In this example of FIG. 10, the FBG part 26 and the FBG part 27 are formed adjacent to the same optical cable 25. Here, the Bragg wavelength of the FBG part 26 differs from that of the FBG part 27. Such configuration can be attained by, for example, forming the FBG parts having the same Bragg wavelength adjacent to each other on the same optical fiber 25, and by applying different pretension to the FBG part 26 and the FBG part 27 when the optical fiber 25 is fixed to the sensor base 24 with the fixing agent 35.

Figure 11:
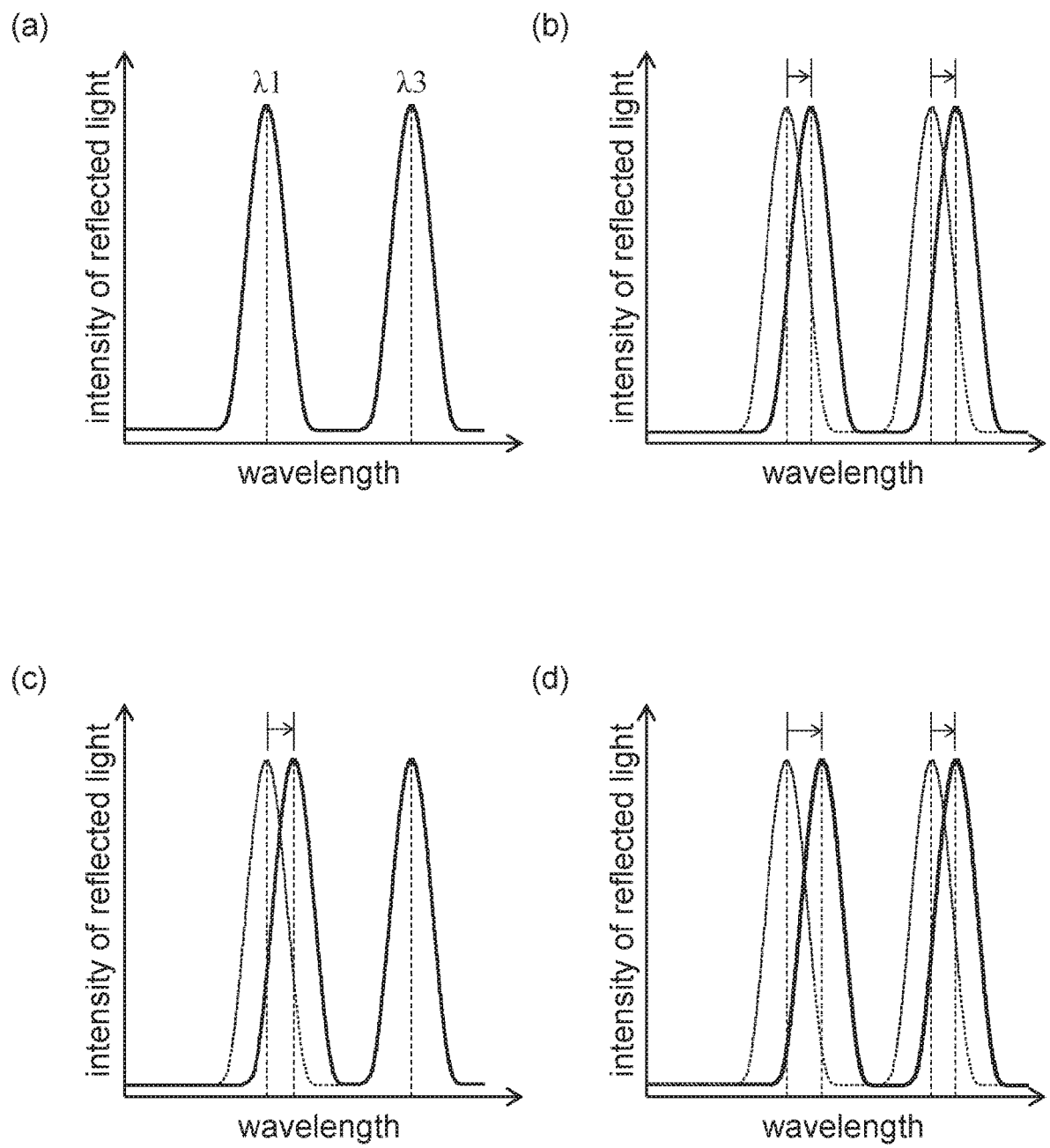
FIG. 11 (a) to FIG. 11 (d) show an example of the spectrum of reflected light of the opening and closing detection sensor in accordance with one embodiment of the present invention.

FIG. 11 (a) to FIG. 11 (d) are schematic views showing an example of variations in the reflected light spectrum when a temperature change occurs in the opening and closing detection sensor 2. FIG. 11 (a) shows the reflected light spectrum when wide-bandwidth light, including the Bragg wavelength of the FBG part 26 and the FBG part 27, enters the opening and closing detection sensor 2 being in an on-state. FIG. 11 (b) is a schematic view showing the variations in the peak wavelengths in the reflected light spectrum when only the temperature change (temperature rise) occurs in the opening and closing detection sensor 2 being in the on-state. FIG. 11 (c) is a schematic view showing the variation in the peak wavelength in the reflected light spectrum, when the temperature is kept constant, and only the change from the on-state to the off state occurs in the opening and closing detection sensor 2 being in the on-state. FIG. 11 (d) is a schematic view showing the variations in the peak wavelengths in the reflected light spectrum, when the temperature change (temperature rise) and the change from the on-state to the off state occur in the opening and closing detection sensor 2 being in the on-state. In FIG. 11 (a) to FIG. 11 (d), horizontal axis corresponds to the wavelength of the reflected light and vertical axis corresponds to intensity of the reflected light. In FIG. 11 (b) to FIG. 11 (d), the reflected light spectrum before the variations are indicated by dashed lines.

As shown in FIG. 11 (a), the reflected light spectrum of the opening and closing detection sensor 2 in the on-state at a specific temperature has its peaks at the Bragg wavelength λ1 of the FBG part 26 and a Bragg wavelength λ3 of the FBG part 27 respectively. Also, as shown in FIG. 11 (*b*), when only the temperature change occurs, variations of a refractive index and expansion occur in both of the FBG part 26 and the FBG part 27 for correcting temperature due to the temperature change. Thereby, the Bragg wavelengths of both of the FBG parts 26 and 27 shift toward larger wavelength. As shown in FIG. 11 (*c*), when only the change from the on-state to the off-state occurs, the Bragg wavelength of the FBG part 26 shifts toward larger wavelength in response to the movement of the moving base 23 associated with the change in the state as described above. At this time, no change occurs in the FBG part 27 for correcting temperature, and thereby the Bragg wavelength of the FBG part 27 does not very.

When the temperature change occurs together with the change from the on-state to the off-state, the above variations are combined with each other. In other words, as shown in FIG. 11 (*d*), a wavelength shift in response to the temperature change and a wavelength shift in response to the change from the on-state to the off-state superimposedly occur in the Bragg wavelength of the FBG part 26, and only the wavelength shift in response to the temperature change occurs in the Bragg wavelength of the FBG part 27.

For example, in FIG. 11 (*d*), a shift amount of the Bragg wavelength in the FBG part 27 is assumed to be 0.3 nm, and the shift amount of the Bragg wavelength in the FBG part 26 is assumed to be 0.6 nm. In this case, assuming that a shift amount of the wavelength generated only by the temperature change in FIG. 11 (*b*) is equal in the FBG part 26 and the FBG part 27, the shift amount of the Bragg wavelength generated only by the change from the on-state to the off-state in FIG. 11 (*c*) is 0.6 nm–0.3 nm=0.3 nm. In this manner, the temperature correction can be attained by measuring the shift amount of the Bragg wavelength in the FBG part 26 and the shift amount of the Bragg wavelength in the FBG part 27.

As described above, according to the present invention, when the opened and closed states of the object to be detected are changed extremely slowly, and when the frequency of the change of the opened and closed states is extremely low, the change of the opened and closed states can be certainly detected.

The above-described embodiments do not limit a technical scope of the present invention, and, other than those already described above, various modifications and applications are possible within the scope of the present invention. For example, in the above embodiments, the FBG part 26 of the optical fiber 25 is linearly disposed, and the moving member 30 is configured to move along the axis of the FBG part 26 as a particularly preferred embodiment, but as long as the Bragg wavelength is configured to vary in response to the interval between the moving base and the fixed base, the FBG part and the moving member can be disposed at any place. Further, in the above embodiments, it is described that the locking part 30*c* is configured to directly move the moving base 23 by abutting on the moving base 23, but it is possible to adopt a configuration where the locking part 30*c* indirectly moves the moving base 23 without directly abutting on the moving base 23. In addition, it is possible to change a shape of the locking part 30*c* into any shape. Similarly, shapes of the case 10 and the moving member 30 are not limited to a cylindrical shape, but for example, other hollow shape such as a rectangular cylindrical shape can be adopted.

Further, in the above embodiments, the position of the moving member 30 in the off-state (the second position) is defined by the level difference 10*c* formed on the inner circumferential surface of the case 10, but as long as the position of the moving member 30 can be defined when the abutment part 30*a* is separated from the object to be detected, any configuration can be adopted. For example, it is also possible to define a position where the bolt 44, which is screwed at the end part of the rail 41 which regulates the moving direction of the moving base 23, abuts on the moving base 23 as the position of the moving member 30 being in the off-state.

Furthermore, in the above embodiment, the helical spring 12 is exemplified as the energizing member, but the energizing member having any known configuration can be used. Also, it is sufficient if the moving member 30 can be movable over the on-state and the off-state in response to the opening and the closing of the object to be detected, use of the energizing member is not a requirement. For example, instead of the energizing member, it is possible to adopt a mechanical mechanism.

In addition, in the above-described embodiments, the moving member 30 has its length in the axis direction to an extent being able to house the sensor 20 inside thereof, but housing the sensor 20 inside the moving member 30 is not a requirement, and the moving member 30 may have any length in the axis direction.

Also, in the above-described embodiments, the moving member 30 having the configuration of which the abutment part 30*a* abuts on the object to be detected is disclosed, but the moving member 30 is not necessarily required to abut on the object to be detected if the moving member 30 can be movable in response to the opening and closing of the object to be detected. For example, in the example of detecting the opening and closing of the manhole cover as shown in FIG. 8 (*a*) to FIG. 8 (*d*), for example, it is also possible to adopt a configuration where one end of a link mechanism has an abutment part abutting on the manhole cover 82, another end thereof has an actuator moving in a horizontal direction in response to the opening and closing of the manhole cover 82, and the opening and closing detection sensor 1 is disposed to be connected to the actuator horizontally to the axis of the case 10.

INDUSTRIAL APPLICABILITY OF INVENTION

According to the present invention, when the opened and closed states of the object to be detected are changed extremely slowly, and when the frequency of the change of the opened and closed states is extremely low, the change of the opened and closed states can be certainly detected, thereby being useful as the opening and closing detection sensor.

DESCRIPTION OF REFERENCE SIGNS 1,2 opening and closing detection sensor
10 case
12 helical spring (energizing force)
20, 50 sensor part
21 base member
22 fixed base (a first base member)
23 moving base (a second base member)
24 sensor base
25 optical fiber
26 FBG part
27 FBG part (for temperature compensation)

30 moving member
30a abutment part
30c locking part

The invention claimed is:

1. An opening and closing detection sensor using an optical fiber, comprising:
a first base member;
a second base member configured to be disposed so as to be movable relative to the first base member;
an optical fiber having an FBG (Fiber Bragg Grating) part where a Bragg wavelength varies in response to an interval between the first base member and the second base member;
a moving member configured to move between a first position and a second position, the first position corresponding to either one of an opened state and a closed state of an object to be detected, the second position corresponding to the other state; and
a locking part, provided in the moving member, configured to move the second base member together with the moving member by abutting on the second base member between a third position and the second position, the third position located between the first position and the second position, and moving the second base member in a direction being separated from the first base member.

2. The opening and closing detection sensor according to claim 1, wherein a portion that includes the FBG part of the optical fiber is linearly disposed, and the second base member and the moving member move along an axis direction of the linearly disposed optical fiber.

3. The opening and closing detection sensor according to claim 2, further comprising an energizing member configured to apply an energizing force in a direction from the first position toward the second position.

4. The opening and closing detection sensor according to claim 2, wherein the moving member has an abutment part that abuts on the object to be detected.

5. The opening and closing detection sensor according to claim 2, wherein the moving member is configured by a hollow member, and the first base member, the second base member, and the optical fiber are disposed inside the moving member.

6. The opening and closing detection sensor according to claim 2, wherein, under a circumstance where the first base member comes into contact with the second base member, the optical fiber is fixed on the first base member and the second base member in a state where a compression force along the axis direction of the optical fiber is applied to the FBG part.

7. The opening and closing detection sensor according to claim 2, further comprising an FBG part for temperature compensation on the first base member.

8. The opening and closing detection sensor according to claim 1, further comprising an energizing member configured to apply an energizing force in a direction from the first position toward the second position.

9. The opening and closing detection sensor according to claim 8, wherein the moving member has an abutment part that abuts on the object to be detected.

10. The opening and closing detection sensor according to claim 8, wherein the moving member is configured by a hollow member, and the first base member, the second base member, and the optical fiber are disposed inside the moving member.

11. The opening and closing detection sensor according to claim 8, wherein, under a circumstance where the first base member comes into contact with the second base member, the optical fiber is fixed on the first base member and the second base member in a state where a compression force along the axis direction of the optical fiber is applied to the FBG part.

12. The opening and closing detection sensor according to claim 8, further comprising an FBG part for temperature compensation on the first base member.

13. The opening and closing detection sensor according to claim 1, wherein the moving member has an abutment part that abuts on the object to be detected.

14. The opening and closing detection sensor according to claim 13, wherein the moving member is configured by a hollow member, and the first base member, the second base member, and the optical fiber are disposed inside the moving member.

15. The opening and closing detection sensor according to claim 13, wherein, under a circumstance where the first base member comes into contact with the second base member, the optical fiber is fixed on the first base member and the second base member in a state where a compression force along the axis direction of the optical fiber is applied to the FBG part.

16. The opening and closing detection sensor according to claim 13, further comprising an FBG part for temperature compensation on the first base member.

17. The opening and closing detection sensor according to claim 1, wherein the moving member is configured by a hollow member, and the first base member, the second base member, and the optical fiber are disposed inside the moving member.

18. The opening and closing detection sensor according to claim 1, wherein, under a circumstance where the first base member comes into contact with the second base member, the optical fiber is fixed on the first base member and the second base member in a state where a compression force along the axis direction of the optical fiber is applied to the FBG part.

19. The opening and closing detection sensor according to claim 1, further comprising an FBG part for temperature compensation on the first base member.

* * * * *